(12) United States Patent
Beresford

(10) Patent No.: US 9,737,740 B2
(45) Date of Patent: Aug. 22, 2017

(54) TEMPERATURE-CONTROL SYSTEM AND METHOD

(71) Applicant: Alan Beresford, Bury St. Edmunds (GB)

(72) Inventor: Alan Beresford, Bury St. Edmunds (GB)

(*) Notice: Subject to any disclaimer, the term of this patent is extended or adjusted under 35 U.S.C. 154(b) by 155 days.

(21) Appl. No.: 14/372,351

(22) PCT Filed: Jan. 15, 2013

(86) PCT No.: PCT/GB2013/050082
§ 371 (c)(1),
(2) Date: Jul. 15, 2014

(87) PCT Pub. No.: WO2013/104932
PCT Pub. Date: Jul. 18, 2013

(65) Prior Publication Data
US 2015/0053430 A1    Feb. 26, 2015

(51) Int. Cl.
*A62C 99/00*    (2010.01)
*A62C 2/06*    (2006.01)
(Continued)

(52) U.S. Cl.
CPC .................. *A62C 3/14* (2013.01); *A62C 3/16* (2013.01); *A62C 35/00* (2013.01); *A62C 37/44* (2013.01);
(Continued)

(58) Field of Classification Search
CPC ........... A62C 5/00; A62C 5/002; A62C 5/008; A62C 5/02; A62C 5/022; A62C 5/024; A62C 5/027; A62C 5/033
(Continued)

(56) References Cited

U.S. PATENT DOCUMENTS 3,727,424 A * 4/1973 Edens ...................... F24F 1/02
62/262
3,830,307 A    8/1974 Bragg et al.
(Continued)

FOREIGN PATENT DOCUMENTS

CA    2 568 719 A1    5/2008
CN    101637772    2/2010
(Continued)

*Primary Examiner* — Arthur O Hall
*Assistant Examiner* — Viet Le
(74) *Attorney, Agent, or Firm* — Hamre, Schumann, Mueller & Larson, P.C.

(57) ABSTRACT

A temperature-control and fire-suppression system is provided for a system space, which optionally houses IT equipment. The system space has a ventilation system for providing controlled temperature air, for example to the IT equipment. A store of a fire-suppressing gas in liquid form is coupled to a supply means for supplying the fire-suppressing gas in liquid form to the system space, such that evaporation of the fire-suppressing gas in liquid form cools, or absorbs energy, from, the air in the system space. A temperature sensor is provided for sensing a temperature in the system space and a controller is responsive to the sensed temperature for controlling the supply means, to supply the fire-suppressing gas in liquid form while maintaining the sensed temperature above a predetermined lower temperature.

23 Claims, 3 Drawing Sheets

(51) Int. Cl.
  *A62C 3/16* (2006.01)
  *H05K 7/20* (2006.01)
  *A62C 35/00* (2006.01)
  *A62C 37/44* (2006.01)

(52) U.S. Cl.
  CPC ..... *A62C 99/0018* (2013.01); *H05K 7/20745* (2013.01)

(58) Field of Classification Search
  USPC .................................. 169/44, 5, 14, 16, 15
  See application file for complete search history.

(56) References Cited

U.S. PATENT DOCUMENTS

| | | |
|---|---|---|
| 4,378,920 A | 4/1983 | Runnels et al. |
| 7,594,545 B2 | 9/2009 | Love |
| 2002/0070035 A1 | 6/2002 | Grabow et al. |
| 2005/0269109 A1 | 12/2005 | Maguire |
| 2009/0014187 A1* | 1/2009 | Wagner .................. A62C 3/004 169/46 |
| 2010/0154448 A1 | 6/2010 | Hay |

FOREIGN PATENT DOCUMENTS

| | | |
|---|---|---|
| DE | 41 16 777 | 11/1992 |
| DE | 100 51 662 | 5/2002 |
| DE | 103 11 556 | 9/2004 |
| DE | 10 2010 013 805 | 10/2011 |
| FR | 2 748 396 | 11/1997 |
| GB | 2478902 | 9/2011 |
| JP | 2002-191713 A | 7/2002 |
| JP | 4 474 425 | 3/2010 |
| KR | 10-2010-0033003 | 3/2010 |
| WO | WO 03/061769 A1 | 7/2003 |
| WO | WO 2006/103364 A1 | 10/2006 |
| WO | WO 2008/145218 A1 | 12/2008 |
| WO | WO 2012/125055 A1 | 9/2012 |

* cited by examiner

TEMPERATURE-CONTROL SYSTEM AND METHOD

This invention relates to a combined cooling and fire suppression/extinguishing system for a system space, such as a space for housing Information Technology (IT) equipment. In particular the invention provides both cooling and fire suppression for a ventilation system for such a system space.

BACKGROUND

The prior art teaches that in closed spaces, such as buildings or other facilities, gas-based fire-suppression or extinguishing systems can be used. Such systems involve injection of a fire-suppressing gas (commonly Argonite or FM200) from an array of high-pressure gas bottles into the closed space to reduce the oxygen level in the air, so as to suppress or extinguish a fire. This may be referred to as flooding the closed space with the fire-suppressing gas. Often, the closed space is also equipped with a ventilation system, for example for cooling. But a ventilation system cannot normally be employed concurrently with a gas-based fire suppression or extinguishing system because the ventilation system typically draws in air from the ambient atmosphere outside the ventilated space. If a fire-suppressing gas is injected into such a ventilation system the incoming air would continually dilute the fire-suppressing gas and reduce its effect.

A ventilation system which draws in ambient air, sometimes supported by evaporative cooling (or other refrigeration-based cooling), can be used for cost-effective, low-energy cooling of buildings and facilities. A typical example of this is the cooling in the information Technology (IT) sector of data centres, server rooms and telecommunication equipment. Such IT equipment or apparatus, which may include computing, telecommunications and similar types of equipment, generates heat during normal operation and needs to be appropriately cooled. In large systems, such as may be found in data centres, server rooms and the like, IT equipment is contained within a system space and ventilation is typically used to assist cooling. This may involve a re-circulating ventilation system, using a refrigeration unit, or a ventilation system drawing in ambient air, which may for example be assisted by refrigeration or by evaporative cooling.

System spaces for housing IT equipment are conventionally designed to meet predetermined standards for cooling, such as the ASHRAE (American Society of Heating, Refrigeration and Air-conditioning Engineers) standards, which set out standard-compliant temperature ranges and recommended temperature ranges to be achieved by ventilation systems. For example, the ASHRAE standards set a compliant temperature range of 10° C. to 35° C., and a recommended temperature range of 18° C. to 27° C., for air supplied by ventilation systems to system spaces containing IT equipment, combined with predetermined air flow rates.

A data centre may contain numerous items of IT equipment, operating independently of one another. In the event of a fire alarm or fire, only one or some of the items of IT equipment may be affected by the fire. In reacting to the fire alarm or suppressing the fire, it is therefore important to continue to provide cooling (ventilation) to the unaffected items of IT equipment, so that they can continue normal live operation. In a re-circulating, refrigeration-based, cooling system, a fire-suppressing gas can be injected into the system space to reduce the oxygen concentration, while air re-circulation and refrigeration can continue, in order to cool the operational IT equipment. However, in a ventilation system which draws air from the ambient atmosphere, if the oxygen concentration in the system space is to be reduced, it is necessary to close the ventilation system's air inlet when injecting the fire-suppressing gas in order to avoid diluting the fire-suppressing gas. But closing the air inlet prevents the normal operation of the ventilation system to cool the IT equipment, and so there is a risk that the operational IT equipment will overheat. In conventional data-centre systems and similar IT systems, this problem is addressed by installing a refrigeration-based cooling system in the system space (in addition to the ambient-air ventilation system). The refrigeration-based cooling system is inactive during normal operation of the IT systems, and is only activated during a fire alarm or fire, for cooling the system space when the normal air inlet is closed and ambient air cannot be drawn into the system space for cooling. The provision of a refrigeration-based cooling system solely for use in the event of a fire alarm or fire disadvantageously significantly increases the capital cost, complexity and maintenance cost of the infrastructure for such an IT system.

STATEMENT OF INVENTION

The invention provides a temperature-control and fire-suppression system for a system space or for a ventilation system and methods for controlling and operating such a system, as defined in the appended independent claims to which reference should now be made. Preferred or advantageous features of the invention are set out in dependent sub-claims.

In a preferred embodiment, the invention may thus provide a temperature-control and fire-suppression system for a system space or for a ventilation system. The system space has a ventilation system for providing a flow of cooled, or controlled-temperature, air to cool or control the temperature of, the system space during normal operation. The ventilation system may be a fully-re-circulating ventilation system in which air in the system space is re-circulated through a refrigeration unit, or (preferably) the ventilation system may draw in ambient air for cooling, optionally assisted by evaporative cooling or refrigeration. Alternatively, the ventilation system may comprise a combination of these systems, or any other suitable system, for cooling or controlling the temperature of the system space during normal operation. The system space may house heat-generating equipment which requires cooling, such as IT equipment.

In this document the term system space is used where appropriate to include both the portion of the system space which needs cooling, or to which a flow of controlled-temperature air is to be provided, and any ventilation channel(s) and other ventilation equipment coupled to that portion of the system space and which function to generate or provide the cooled air, or the flow of controlled-temperature air. In effect, the terms system space and ventilation system may be interpreted as encompassing all of the space through which the air in the system circulates. Thus, the ventilation system and the system space are generally the same, or coextensive.

In the preferred embodiment, the fire-suppression and temperature-control system may comprise a store of a fire-suppressing gas in liquid form, a supply means for supplying the fire-suppressing gas in liquid form to the system space or ventilation system, such that evaporation of the fire-suppressing gas cools the air in the system space or ventilation system, a temperature sensor for sensing a temperature in the system space or ventilation system, and a controller responsive to the sensed temperature (sensed by the temperature sensor) for controlling the supply means. The controller advantageously controls the gas-supply means to supply the fire-suppressing gas so as to maintain the sensed temperature above a predetermined lower or minimum temperature.

Maintaining the sensed temperature above a predetermined lower or minimum temperature, or within a predetermined temperature range, may advantageously enable the system to make use of this cooling effect of the supply of fire-suppressing gas in liquid form while maintaining effective cooling, or temperature control, for any live IT equipment in the system space which is unaffected by the fire event or condition.

The requirement to maintain the sensed temperature above a predetermined lower temperature may reduce or constrain the rate of supply of the fire-suppressing gas in liquid form, or the average rate of supply of the fire-suppressing gas in liquid form over a period of time, because if the gas is supplied too rapidly, then the cooling effect of the evaporation of the fire-suppressing gas may tend to reduce the sensed temperature below the predetermined lower temperature.

The supply means for supplying the fire-suppressing gas may comprise a valve or tap controlled by the controller which may use any suitable protocol for controlling the rate of supply of the gas in liquid form. For example, the valve or tap may be able to supply the gas at a variable rate, so as to modulate the rate of supply, or to turn the supply of the gas on or off for controlled or predetermined intervals, so as to provide a desired average rate of supply of the gas over a period of time. The supply means may comprise any suitable form of injector for introducing the gas in liquid form into the ventilation system. This may involve a simple nozzle or injector for injecting the gas in liquid form, or a more complex structure for dispersing the gas in liquid form, for example as a spray.

The predetermined lower temperature may advantageously correspond to a standard-compliant minimum temperature, for example set by the ASHRAE standards, or some other temperature such as a recommended minimum temperature, or a temperature set by an operator.

In this preferred embodiment, the invention may thus overcome the need for a traditional gas-based fire-suppression system to be supported by a separate refrigeration system which can cool re-circulating air (as described above in relation to the prior art). This is achieved by using the energy used to evaporate the fire-suppressing gas in liquid form for cooling, and the resulting gaseous fire-suppressing gas for oxygen depletion. The system may thus provide both cooling and fire suppression, including for example hypoxic fire control and/or full fire extinguishing.

During a fire condition, the supply of fire-suppressing gas in liquid form may thus also be used to provide cooling to prevent a sensed temperature in the system space from rising above a predetermined upper or maximum temperature, such as a minimum standard-compliant or recommended temperature, or a maximum temperature set by an operator.

The energy required to evaporate the fire-suppressing gas in liquid form includes the latent heat of evaporation of the liquid and may also include a component of sensible heat, if the fire-suppressing gas in liquid form is stored at low temperature.

Note that this invention may apply to systems employing different fire-suppressing gases. However, the fire-suppressing gas in liquid form preferably is, or comprises, liquid nitrogen. The resulting fire-suppressing gas is therefore preferably nitrogen, or a mixture of nitrogen with other suitable fire-suppressing gases. For example, options for the fire-suppressing gas may include gases containing different concentrations of liquid nitrogen. If impure (e.g. industrial grade) nitrogen is used, the gas may be a mixture of nitrogen with typical contaminant gases. For the purpose of explanation and description in the embodiments described below, the use of nitrogen (pure or industrial grade) may be referred to by way of example.

A preferred embodiment of the invention may therefore involve or consist of the vaporisation of nitrogen in a ventilation system, which may be a ventilation system which draws in ambient air or a fully re-circulating ventilation system. Liquid nitrogen is preferably added to air in an air stream of the ventilation system. The air is cooled as it provides the energy to convert the liquid nitrogen into a gas. This may be a combination of latent and sensible heat of the nitrogen. Fire suppression or extinguishing is achieved by reducing or depleting the oxygen in the air stream and the system space.

A control system may advantageously be used to maintain a desired cooling (or temperature) level and/or a target oxygen level. Such a control system may advantageously comprise one or more temperature sensors and/or one or more oxygen concentration sensors providing feedback, or control, signals to a controller for controlling the gas supply means.

A system embodying the invention may advantageously comprise a store, or supply, of liquid nitrogen (or other gas) and a supply means, such as an injector or injectors, for injecting the liquid nitrogen into air in the ventilation system. If the fire-suppressing gas is nitrogen, then it may advantageously be stored in liquid form at low temperature, in a thermally-insulated storage vessel or container. Other fire-suppressing gases may be storable in the same way. If an alternative fire-suppressing gas is used which can be stored in liquid form under pressure at room, or ambient, temperature, then low-temperature storage may optionally not be used; when such a gas in liquid form is injected into the air in the ventilation system or ventilation space, the latent heat of evaporation will nevertheless absorb energy from the air and cool the air, or reduce its temperature.

The supply means for supplying nitrogen (or other gas) in liquid form into the ventilation system may be controlled by the controller, which may control the time, duration, rate of supply and/or average rate of supply of liquid nitrogen. The controller may be responsive to fire-detection apparatus, such as one or more smoke detectors, heat detectors and/or VESDA (very early smoke detection apparatus).

The ventilation system in an embodiment of the invention may be a fully re-circulating system but is preferably a ventilation system which draws ambient air into the system space, as this is more energy efficient. In a ventilation system which draws in ambient air, the temperature of air supplied to the system space (or the portion of the system space for which a controlled-temperature air supply is required) may be controlled by mixing ambient air, which is optionally cooled by evaporative cooling or a refrigeration system, with air which has been warmed by passing through the system space, to form an air stream entering the temperature-controlled portion of the system space. Such an arrangement may comprise an ambient air inlet, a vent or exhaust to the ambient atmosphere for unwanted air which has passed through the system space, and a controllable re-circulation channel for mixing air re-circulated from the system space with incoming ambient air. The air flow in this ventilation system may be driven by a pressure drop generated by a fan, and the ambient air inlet, the air vent and/or the air flow through the re-circulation channel may be controllable, for example by one or more air-flow controllers in the form of variable resistive elements or dampers, to achieve the desired air mixing.

In a conventional system of this type, parameters such as the temperature and flow rate of the air in the ventilation system entering the system space are typically monitored and may be used to provide inputs to a ventilation controller for controlling the air flow through the ambient air inlet, the air vent and the re-circulation channel, and for controlling any cooling (for example by refrigeration or evaporative cooling) of the ambient air drawn into the system, to achieve a target temperature and a target flow rate of the air entering the system space.

Ventilation systems of this type are known from the prior art, such as GB2478902, and are particularly effective for implementing evaporative cooling, in order to achieve effective cooling with low energy consumption. As described above, such ventilation systems combine the intake of ambient air and a re-circulation channel or system forming part of, or coupled to, the system space.

Fire sensors, smoke sensors and/or thermal sensors or the like may be installed to detect fire or the onset of fire in the system space. The controller of a fire-suppression system may be responsive to one or more outputs of such sensors. The severity of a fire alarm may be determined by the number of sensors detecting a fire event or condition, or the types of sensors detecting a fire event or condition. Alternatively, the controller may be manually operated by an operator. In the event of a fire alarm or fire it may be appropriate to control a system embodying the invention so as to achieve different oxygen concentrations in the system space depending on the severity of the fire alarm or fire. For example, in the event of a low-level or early-warning fire alarm, as might be triggered by a VESDA, it may be desirable only to reduce the oxygen level in the system space to a hypoxic level such as 17%, 18% or 19% oxygen, or a concentration in the range of 16% to 19% oxygen. This may be sufficient to prevent a fire from developing or spreading, while retaining a breathable atmosphere in the system space so that, for example, an operator could check the status of IT equipment in the system space. In response to a more serious fire alarm or fire event, it may be desirable to lower the oxygen concentration further, for example to a fire-extinguishing level, such as 15% or 12% or 10% or less, or a concentration in the range of 8% to 15% oxygen, or 10% to 15% oxygen. In response to a still more serious fire alarm or event, it may be desirable to reduce the oxygen concentration as far as possible, or to flood the system space with the fire-suppressing gas.

When the fire-suppressing gas in liquid form is introduced into the ventilation system, it may be desirable to reduce the quantity, or flow rate, of any ambient air being drawn into the ventilation system, in order to prevent dilution of the fire-suppressing gas. This may reduce the cooling capacity of the ventilation system, but this may advantageously be offset by the supply of fire-suppressing gas in liquid form cooling the air in the system, through the latent heat of evaporation.

In the event of a fire alarm or fire, it may be important to reduce the oxygen level in the system space to a desired or predetermined oxygen concentration as quickly as possible. However, if liquid nitrogen, or other fire-suppressing gas in liquid form, is injected into the ventilation system too rapidly, then the temperature of the air supplied to the system space may fall below a desired temperature level, or below a standard-compliant or recommended minimum temperature, for example according to the ASHRAE standards. The supply means for supplying the fire-suppressing gas should therefore, according to a preferred aspect of the invention, supply the fire-suppressing gas in liquid form at, or close to, a maximum rate which does not cause the temperature of the air supplied by the ventilation system to the system space to fall below a predetermined lower, or minimum, temperature. This may, for example, advantageously allow any live IT equipment which is unaffected by a fire in a system space to continue in normal operation while the fire is suppressed.

The controller for controlling the fire-suppressing gas-supply means may therefore advantageously be responsive to a temperature measured at a suitable point in the system space or its ventilation system. Typically, standards for ventilation to cool IT equipment in, for example, data centres and server rooms, specify a temperature of air in the ventilation system upstream of the IT equipment, or a temperature of the air being delivered to the IT equipment by the ventilation system. Accordingly, the controller for the fire-suppressing gas supply means may be responsive to or comprise a sensor for sensing or monitoring the temperature of the air in the system space upstream, and preferably immediately upstream, of the IT equipment or of a portion of the system space requiring cooling.

The predetermined lower, or minimum, temperature may correspond to a minimum recommended temperature or a minimum standard-compliant temperature as described above. However, an operator of the system may select another predetermined lower temperature for use by the controller. For example, in the event of a fire alarm or fire, it may be desirable to reduce the oxygen concentration in the system space as rapidly as possible to a desired target oxygen concentration. For example, since the fire alarm or fire may constitute an emergency, and since the supply of fire-suppressing gas to reduce the oxygen concentration to a predetermined target concentration may only take a short time (typically between one and five minutes), it may be acceptable to set the predetermined lower, or minimum, temperature below a normal standard-compliant minimum temperature during this period. Exposure of live IT equipment in normal operation to air supplied by a ventilation system at a temperature below a standard-compliant temperature for a short period of time may be acceptable without risking damage to the IT equipment or affecting its normal operation. This may allow the fire-suppressing gas to be supplied more rapidly than if the predetermined lower temperature is set at the standard-compliant minimum temperature, and may allow the oxygen concentration in the system space to be reduced more rapidly to a desired level in response to the fire alarm or fire. The predetermined lower temperature used by the controller may then be returned to the standard-compliant minimum temperature, or other predetermined temperature (such as a minimum recommended temperature), while the oxygen concentration is maintained at the reduced, target, oxygen concentration.

The inventor has found that the aim of reducing the oxygen level in the system space as quickly as possible, while providing cooling, can surprisingly be better achieved using liquid nitrogen rather than other gases such as carbon dioxide. This is because the latent heat of evaporation of nitrogen is lower than for carbon dioxide. Therefore, for a given level of cooling of the air in the ventilation system, liquid nitrogen can be injected into the ventilation system more rapidly than liquid carbon dioxide. This enables the oxygen level in the system space to be reduced more rapidly using liquid nitrogen than using liquid carbon dioxide, for a given reduction in the temperature of the air entering the system space from the ventilation system.

In the event of a particularly serious fire alarm or fire, it may be more important to reduce the oxygen level in the system space as far as possible, as quickly as possible. For example in the event of a serious fire, it may be more important to suppress or extinguish the fire as quickly as possible than to maintain the cooling within the system space within standard-compliant or recommended limits. In such a case, the fire-suppressing gas in liquid form may be supplied by the supply means into the system space or ventilation system as rapidly as possible, even though this may cause the temperature sensed by the temperature sensor to drop below a predetermined lower level. In that case, the controller controlling the fire-suppressing gas means may effectively no longer respond to the sensed temperature, but may simply deliver the fire-suppressing gas as rapidly as possible.

In a ventilation system in which, in normal operation, ambient air is drawn into the system as required for cooling, and in which at least a portion of the air heated by passing through the system space is vented to the ambient atmosphere through a vent or exhaust, it may be desirable to close, or partially close, the air inlet and the exhaust when the fire-suppressing gas is supplied, in order to avoid dilution of the fire-suppressing gas in the system space. In a ventilation system of this type, the volumes of air drawn in through the air inlet and vented through the exhaust may be controlled by one or more variable resistive elements, or dampers, controlled by a ventilation-system controller as described above. The ventilation-system controller may be responsive to a temperature sensed by a temperature sensor within the ventilation system, typically upstream, or immediately upstream, of the portion of the system space that requires cooling as described above, to meet ventilation/cooling standards. When increased cooling is required, the controller may increase the volume of ambient air drawn through the air inlet and/or may increase any evaporative cooling or refrigeration of the air drawn through the air inlet. At the same time, the controller may increase the volume of air (warmed by passage through the system space) which is vented through the exhaust, for example by opening the exhaust. Alternatively, when the sensed temperature upstream of the system space decreases, the volumes of air drawn in through the air inlet and vented through the exhaust may be decreased, for example by optionally closing or partially closing the air inlet and/or the exhaust. In addition, or in the alternative, any cooling of the air drawn through the air inlet may be reduced. In such a system, when fire-suppressing gas in liquid form is supplied in the event of a fire alarm or fire, the cooling effect of the supply of gas may reduce the temperature sensed by the temperature sensor coupled to the ventilation-system controller. The controller may therefore automatically reduce the air flow through the air inlet and/or the exhaust, optionally closing or partially closing the air inlet and/or the exhaust, and the controller may increase re-circulation of air through the system space. This may automatically reduce or prevent the dilution of the fire-suppressing gas by ambient air.

In addition, the cooling effect of the supply of fire-suppressing gas to reduce the temperature sensed by the temperature sensor coupled to the ventilation-system controller may advantageously cause the controller to reduce any cooling of the air drawn through the air inlet, for example by evaporative cooling or refrigeration.

Thus, as the fire-suppressing gas is supplied, it cools the air in the ventilation system and the ventilation-system controller may automatically compensate, by closing the air inlet and/or exhaust, optionally adjusting the quantity of air re-circulated through the system space, and/or adjusting any cooling of the air drawn through the air inlet.

In a first control mode, in which the supply of fire-suppressing gas is controlled in order to achieve a predetermined, steady-state, reduced oxygen concentration, such as a hypoxic or a fire-extinguishing oxygen concentration, it is important after the supply of fire-suppressing gas has initially established the desired steady-state oxygen concentration in the system space to be able to maintain that oxygen concentration. To achieve this, in a preferred embodiment of the invention an oxygen concentration sensor monitors the oxygen concentration in the system space. The controller for the fire-suppressing gas supply means is responsive to the sensed oxygen concentration, and will continue to supply the fire-suppressing gas only at a rate, or an average rate over a period of time, required to maintain a desired oxygen concentration.

The required rate of supply, or the average rate of supply, of the fire-suppressing gas may depend on the volume of any ambient air entering the system space and the level of cooling required. For example, in a ventilation system using ambient air for cooling, if a steady-state, hypoxic atmosphere of a particular oxygen concentration is maintained in the system space but the temperature rises because of insufficient cooling, the ventilation-system controller may admit additional ambient air to provide additional cooling. In that case, the oxygen concentration in the system space will tend to rise. The rise in oxygen concentration will be sensed by the oxygen sensor, and cause the supply-means controller to supply additional fire-suppressing gas. This will both reduce the oxygen concentration and provide cooling, causing the volume of air drawn in from the ambient atmosphere to be reduced.

An embodiment of this control system is illustrated in FIG. 1, which shows that if both a sensed temperature is above a predetermined target temperature and a sensed oxygen concentration is above a predetermined target oxygen-concentration, then the gas-supply controller opens the fire-suppressing gas valve and admits more gas in liquid form, to reduce both the oxygen concentration and the temperature. Otherwise, the controller closes the valve of the fire-suppressing gas supply means.

As described above, in the event of a more serious fire alarm or fire, in a second mode of operation of the system it may be desirable to decrease the oxygen concentration as far as possible, while still maintaining the temperature within a desired, or standard-compliant, temperature range. An embodiment of such a control system is illustrated in FIG. 2. In this case, the controller for the fire-suppressing gas supply does not need to respond to the sensed oxygen concentration, but only to supply fire-suppressing gas as rapidly as possible without causing the sensed temperature to fall below a desired lower, or minimum, temperature target.

In a third mode of operation, as described above, in the event of a particularly serious fire alarm or fire the controller may be programmed not to respond directly either to the temperature sensor or the oxygen sensor, but simply to supply fire-suppressing gas as fast as possible, even if this causes the temperature to fall below the desired, or standard-compliant, predetermined lower or minimum temperature. This may extinguish a fire as quickly as possible even though the low temperature may interrupt normal operation of any live IT equipment, or even damage IT equipment.

The description of embodiments of the invention set out above primarily relates to a system comprising a ventilation system which controllably draws ambient air from outside the system space. However, as the skilled person would appreciate, the principles of the supply of fire-suppressing gas in liquid form and the control systems described above may similarly be used in a fully re-circulating ventilation and cooling system, in which air in the system space is re-circulated through a refrigeration unit. In this case, fire-suppressing gas in liquid form may be supplied, and may be used to cool the system space. In a conventional air re-circulating cooling system, the refrigeration unit may be thermostatically controlled. When additional cooling is introduced by the supply of fire-extinguishing gas in liquid form, the cooling generated by the refrigeration unit may therefore automatically reduce. However, as described above, it may be desirable for the temperature of air provided to the system space to remain above a predetermined, or standard-compliant, lower or minimum temperature, and therefore the controller for the gas-supply means may be responsive to a sensed temperature within the system space or its ventilation system. Similarly, as described above, it may be desirable to maintain the oxygen concentration within the system space above a predetermined level, or within a predetermined range, for example to generate a hypoxic atmosphere. To achieve this, the gas-supply controller may be responsive to a signal from an oxygen concentration sensor within the ventilation system or the system space.

In both a ventilation system which admits ambient air for cooling and a fully re-circulating ventilation system, the supply of fire-suppressing gas to the system will increase the mass or quantity of gas within the system space. Consequently, in order to avoid a pressure increase within the system space, a vent or exhaust may be provided to allow at least some gas to escape, for example to the ambient atmosphere. However, once a desired oxygen level has been achieved within the system space, and the supply of fire-suppressing gas has stopped, the vent or exhaust may be closed, to prevent dilution of the fire-suppressing gas. The vent or exhaust for preventing a pressure increase in the system space may be a vent or exhaust provided only for this purpose, or may be another opening or channel between the system space and the ambient atmosphere, such as an existing ventilation-system exhaust or ventilation-system inlet (which may allow an outflow of gas under pressure in the system space).

A very significant advantage of the use of fire-suppressing gas in liquid form is in the reduced cost and increased convenience of operation of a system. In a conventional fire-suppression/extinguishing system for a data centre or server room, an array of high-pressure bottles of a fire-extinguishing gas (such as carbon dioxide, or argon, or Argonite, or FM200, or nitrogen) is stored, and in the event of fire alarm or fire, the fire-suppressing gas is piped or ducted into the system space. The pressurised gas is delivered in gaseous form and so does not significantly cool the air in the system space. The cost of such a supply of high-pressure gas can be very high, and as much £50,000 for the gas required to suppress or extinguish a fire in a typical data-centre room (and a data centre may commonly comprise 10 or more rooms). Because of this high cost, a conventional fire-suppressing gas system only comprises enough high-pressure bottled gas to implement one fire-suppressing sequence. If a second fire occurs, or if the first fire-suppressing sequence fails to extinguish a fire, no further high-pressure bottled gas may be available. Effectively, the cost of a fire-suppressing gas system using conventional high-pressure bottled gas is so high that only a "single-shot" system is typically made available at a data centre. By contrast, a fire-suppressing gas in liquid form, and particularly liquid nitrogen, is considerably cheaper and much easier to store. For example, sufficient liquid nitrogen to generate a hypoxic or fire-suppressing atmosphere within a data centre and to maintain that atmosphere for a significant period of time may cost only a few hundred pounds. This means that a fire-suppression system based on a fire-suppressing gas in liquid form is not only much less expensive than a conventional system, but also means that a sufficient volume of fire-suppressing gas can conveniently be purchased and stored to achieve or implement two or more fire-suppressing sequences.

Advantages

The invention may therefore provide the following advantages compared with a conventional gas-based fire suppression/extinguishing system supported by refrigeration
  Lower complexity
  Simpler controls
  Lower capital cost
  Lower consumables cost
  Lower energy usage
  Lower environmental impact
  The combined cooling and fire suppression/extinguishing system employing liquid nitrogen in a continuously operating ventilation system may thus provide a complete fire suppression/extinguishing system. This may advantageously remove the need for secondary refrigeration and provide a lower cost alternative to conventional gas based fire suppression systems.

This is particularly appropriate as a support process in data centre and server room cooling systems using direct ventilation schemes supported by evaporative cooling.

Three preferred embodiments of the invention may be defined as follows:
1. A liquid nitrogen based cooling and fire suppression system for a re-circulating ventilation system.
2. A liquid nitrogen based cooling and fire suppression system for use in data centres and server rooms in conjunction with a ventilation system.
3. A liquid nitrogen based cooling and fire suppression/extinguishing system for use in data centres and server rooms in conjunction with a ventilation system incorporating evaporative cooling.

In general terms, therefore, in a preferred aspect of the invention a temperature-control and fire-suppression system is provided for a system space, which optionally houses IT equipment. The system space incorporates a ventilation system for providing controlled temperature air, for example to the IT equipment. A store of a fire-suppressing gas in liquid form is coupled to a supply means for supplying the fire-suppressing gas in liquid form to the system space, such that evaporation of the fire-suppressing gas in liquid form cools, or absorbs energy, from, the air in the system space. A temperature sensor is provided for sensing a temperature in the system space and a controller is responsive to the sensed temperature for controlling the supply means, to supply the fire-suppressing gas in liquid form while maintaining the sensed temperature above a predetermined lower temperature.

SPECIFIC EMBODIMENTS AND BEST MODE OF THE INVENTION

Specific embodiments of the invention will now be described by way of example, with reference to the accompanying drawings in which.

Figure 4:
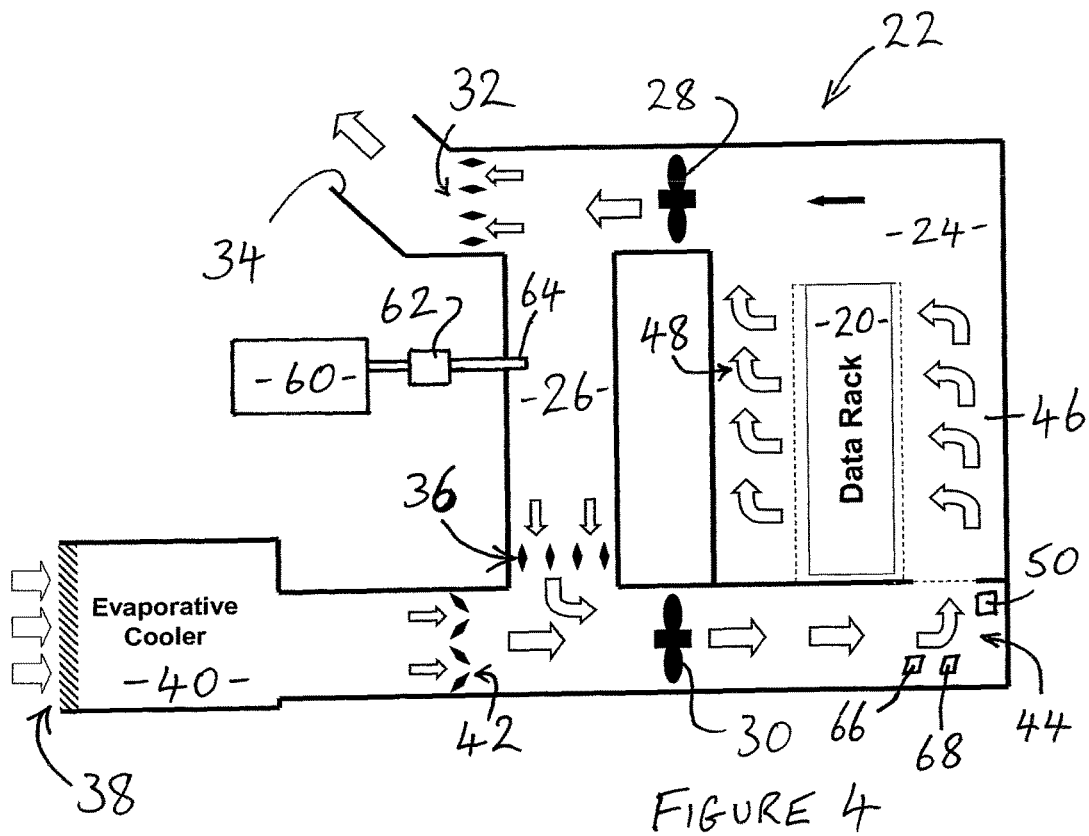
FIG. 4 illustrates a normal operating mode of an embodiment of the invention in a ventilation system for a data centre employing evaporative cooling.
Figure 5:
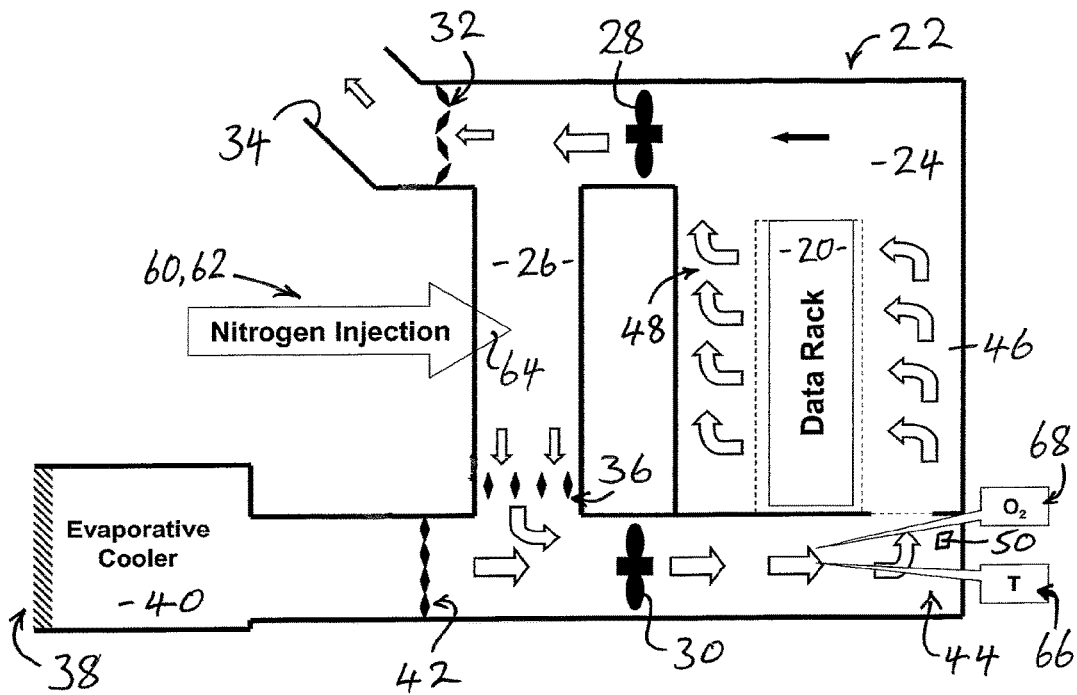
Figure 6:
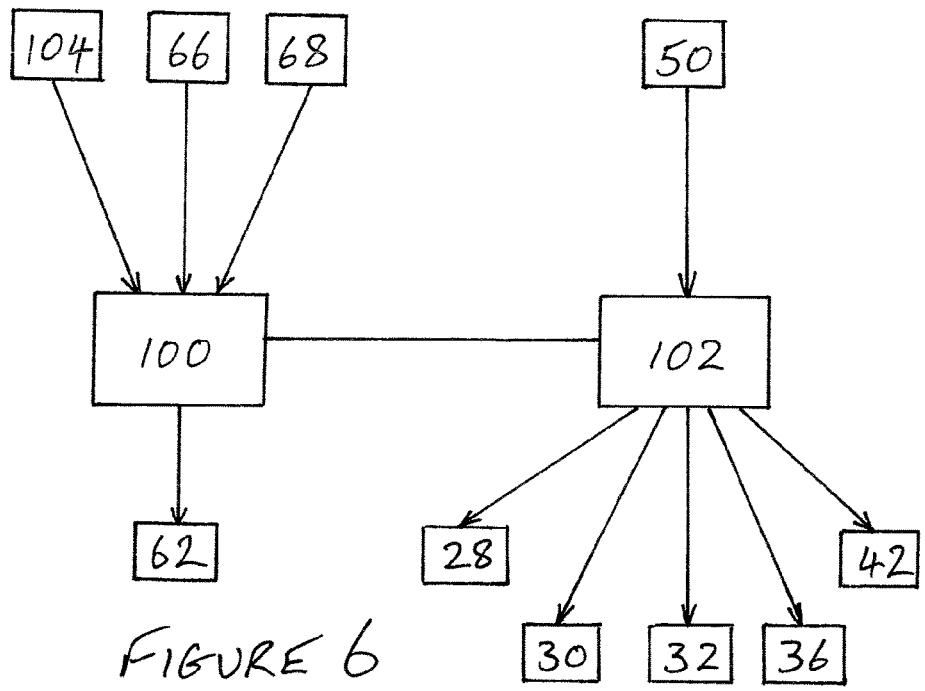

FIG. 5 further illustrates the embodiment of the invention of FIG. 4; and FIG. 6 illustrates a control system for the embodiment of FIG. 5.

Figure 3:
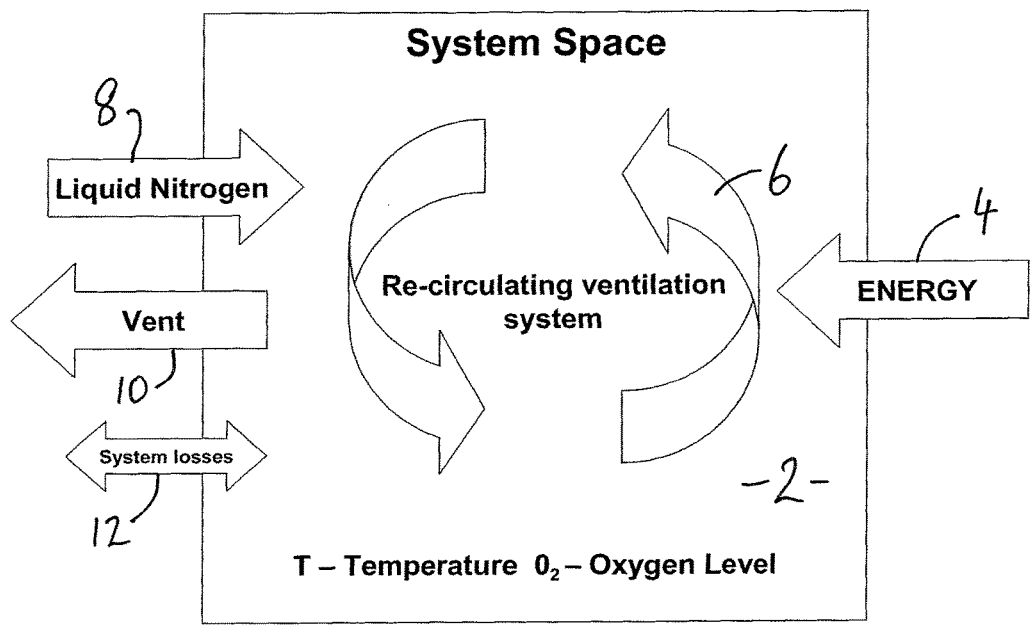
FIG. 3 is a process flow diagram for an embodiment of the invention.

FIG. 3 illustrates the principle of operation of a preferred embodiment of the invention in a system providing ventilation, cooling and fire-suppression in a system space, in particular showing the process flow employed in the embodiment.

Key parameters to be controlled in the system of FIG. 3 are the temperature and the oxygen level in the system space 2.

When energy 4 is added to the system space the temperature will rise unless cooling is used. The system space may be a server room or data centre containing IT equipment, such as computing equipment or telecommunications equipment, and the energy 4 may be added to the system space in the form of heat generated by the IT equipment. In normal operation, the system space is cooled by means of a re-circulating ventilation system 6. The re-circulating ventilation system may be a fully re-circulating system incorporating refrigerative cooling, or a partially re-circulating ventilation system in which ambient air is drawn into the system space, as illustrated in FIGS. 4 and 5.

In the system of FIG. 3, liquid nitrogen 8 may be supplied to the system space, and preferably to the ventilation system of the system space, in order to reduce the oxygen level in the system space for control of fire. The degree of oxygen depletion determines the level of fire control from initial suppression to full extinguishing.

In the event of a fire alarm or fire event, liquid nitrogen 8 is added to the system and vaporised. This is an adiabatic process. The vaporisation process and the raising of the nitrogen gas to the system temperature (the temperature of air in the ventilation system) requires, or absorbs, energy. The amount of energy is dependent upon the latent heat of vaporisation and the sensible heat properties of the nitrogen. This energy comes from the system. The system air is therefore cooled as it gives up its sensible energy to provide the energy for vaporisation.

The amount of cooling is dependent upon the amount of liquid nitrogen added to the system and subsequently vaporised.

The liquid nitrogen (depending on its purity) vaporises into practically pure gaseous nitrogen. The system space is not pressurised so a corresponding volume of system air is displaced from the system through a vent 10. The adding of nitrogen gas to the system therefore results in oxygen depletion.

The rate of oxygen depletion is dependent upon:
The system air volume (the volume of air in the system space, or ventilation system)
The rate of addition of nitrogen gas
Other system losses 12

System losses 12 are illustrated in general terms in FIG. 3, and include parameters such as transfers of both gases and energy between the system space and the ambient atmosphere or environment.

FIG. 4 shows the normal operating mode of a typical server-room cooling system employing ventilation supported by evaporative cooling, and comprising a fire-suppression system embodying the invention.

In normal operation a flow of air maintains the desired operational temperature for IT equipment 20 in a system space 22. This temperature is controlled by a series of dampers and ventilation, supported by evaporative cooling during warm periods, as described below.

The system space 22 comprises a server room or data room 24, containing a data rack of IT equipment 20, and a ventilation recirculation channel 26. Fans 28, 30 are positioned at an outlet from the server room (coupled to an inlet of the ventilation channel) and at an outlet of the ventilation channel (coupled to an inlet of the server room). Air from the inlet of the ventilation channel can also pass through a controllable exhaust damper 32 to an exhaust 34 leading to the ambient atmosphere. Air in the ventilation channel 26 passes through a variable ventilation-channel damper 36. The outlet of the ventilation channel and the inlet to the server room are also coupled to an inlet 38 from the ambient atmosphere. Air drawn through the inlet 38 passes through an evaporative cooler 40 and a controllable atmospheric-inlet damper 42.

A ventilation-system controller 102 (see FIG. 6) controls the fans 28, 30, the exhaust damper 32, the ventilation-channel damper 36, the atmospheric-inlet damper 42 and the evaporative cooler 40 in order to generate a desired, predetermined airflow rate 44 at a desired temperature at the inlet to the server room, where the ventilation air enters a cold aisle 46, in known manner. The air passes through the data rack of IT equipment 20 into a hot aisle 48, before being drawn out of the server-room outlet by the fan 28.

The ventilation-system controller is responsive to a temperature sensor 50 positioned immediately upstream of the cold aisle. Standards such as the ASHRAE standards set a standard-compliant temperature range, and a (narrower) recommended temperature range, for the temperature of controlled-temperature air entering the cold aisle. The temperature sensor 50 measures the air temperature and the controller controls the ventilation system in order to maintain a desired, predetermined temperature at the sensor.

If the sensed temperature measured by the sensor 50 falls too low, the ventilation-system controller may close or partially close the exhaust damper 32, open the ventilation-channel damper 36, and/or close or partially close the atmospheric-inlet damper 42. This increases recirculation of air warmed by the IT equipment 20, tending to increase the temperature of the air measured by the temperature sensor 50.

If the sensed temperature rises above a predetermined threshold temperature, the controller may reduce re-circulation of air warmed by the IT equipment, by increasing the opening of the exhaust damper 32, closing or partially closing the ventilation-channel damper 36, and/or increasing the opening of the atmospheric-inlet damper 42. If the ambient temperature of the atmosphere is low, then this may be sufficient to reduce the sensed temperature measured by the temperature sensor 50. If not, then the controller may activate the evaporative cooler 40, to decrease the temperature of the air drawn through the atmospheric-inlet damper 42.

The system-space ventilation system of FIG. 4 further comprises a fire-suppression system embodying the invention. This comprises a storage vessel 60 for storing liquid nitrogen coupled by suitable pipework through a controllable valve 62 to a nozzle 64 opening into the ventilation channel 26. The valve 62 is controlled by a fire-suppression controller 100 (see FIG. 6) in response to a sensed temperature measured by a temperature sensor 66 and a sensed oxygen concentration measured by an oxygen-concentration sensor 68. Both the temperature sensor 66 and the oxygen-concentration sensor 68 are positioned immediately upstream of the inlet to the cold aisle of the server room. As the skilled person would appreciate, the precise positioning of the sensors may be varied without affecting the principles of operation of the system, but positioning upstream of the inlet to the server room is a preferred position.

FIG. 5 shows the same system when a fire condition has been detected in the building. The same reference numerals are used in FIGS. 4 and 5, but in FIG. 5 the nitrogen supply system 60, 62, 64 and the temperature and oxygen sensors 66, 68 are shown figuratively.

A fire condition may be detected by any conventional fire alarm or detector 104 positioned within the building, or system space. Suitable detectors might include smoke detectors, thermal detectors or VESDAs. The outputs from one or more such detectors may be coupled to the fire-suppression controller 100, which is programmed to implement a fire-suppression protocol. Different control protocols may be implemented depending on the severity of the detected fire condition or event.

Figure 1:
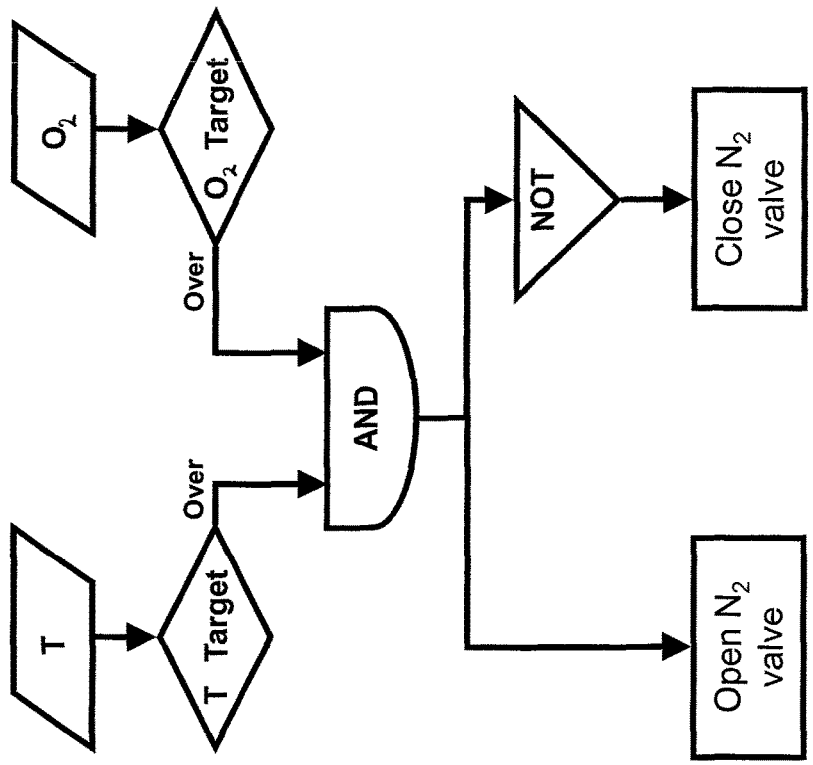
FIG. 1 is a flow chart illustrating the control of a system embodying the invention in a first mode of operation.

In a first control mode, illustrated in FIG. 1 as described above, the fire-suppression controller may take the following steps to implement a hypoxic atmosphere within the server room. This may be appropriate if, for example, a small amount of smoke from a smouldering electronic component is detected, while most of the IT equipment in the server room continues to operate normally. A hypoxic atmosphere of, perhaps, between 15% and 18% oxygen may be sufficient to prevent the outbreak of a fire, while technicians can still enter the server room.

The fire-suppression controller controls the nitrogen injection system 60, 62, 64 to inject liquid nitrogen through the supply means, or injector or nozzle, 64 into the ventilation channel. The liquid nitrogen evaporates, increasing the nitrogen concentration in the air and cooling the air in the ventilation channel. As the nitrogen-enriched, cooled air passes the temperature sensor 66 and the oxygen sensor 68, reductions in temperature and oxygen concentration are monitored and fed back to the controller. At the same time, the drop in the air temperature is sensed by the ventilation-system temperature sensor 50. The ventilation-system controller responds to the temperature drop by closing or partially closing the atmospheric-inlet damper 42 and, if appropriate, switching off the evaporative cooler 40, in order to decrease the effect of cooling by the ventilation system.

It is important in this mode of operation that the temperature of air entering the cold aisle of the server room does not fall below a predetermined, or standard-compliant, temperature in order to maintain continuous operation of live IT equipment. The fire-suppression temperature monitor 66 measures the air temperature and, if it falls below the predetermined lower, or minimum, temperature then the fire-suppression controller reduces the rate of nitrogen injection, to reduce the cooling effect of nitrogen injection. This temperature feedback loop prevents the nitrogen injection from lowering the air temperature too far.

At the same time, the oxygen sensor 68 monitors the oxygen concentration and causes the fire-suppression controller to slow, or switch off, the nitrogen injection when a desired hypoxic oxygen concentration is reached. The fire-suppression controller then controls the rate of nitrogen injection in response to the measured oxygen concentration to maintain the desired hypoxic oxygen concentration in the server room. At the same time, the ventilation-system controller controls the ventilation system to maintain a desired or standard-compliant temperature of the air entering the server room.

The fire-suppression controller operates in a second control mode in response to a more serious fire condition, detected by one or more fire or smoke detectors.

Figure 2:
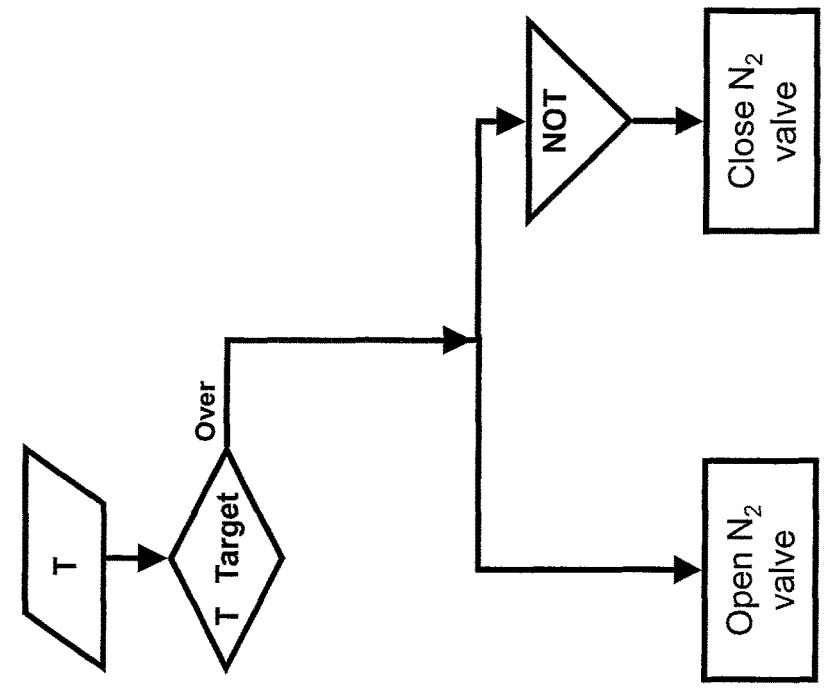
FIG. 2 is a is a flow chart illustrating the control of a system embodying the invention in a second mode of operation.

In this second control mode, illustrated in FIG. 2 as described above, the fire-suppression controller is programmed to reduce the oxygen concentration in the server room as far as possible, or to a lower predetermined level, than the hypoxic level achieved in the first control mode. At the same time, however, in order to maintain normal operation of any IT equipment unaffected by the fire condition, the temperature of the air entering the cold aisle is maintained above a predetermined, or standard-compliant, temperature.

Thus, as in the first control mode, in response to the fire alarm, the fire-suppression controller controls the nitrogen injection system to supply liquid nitrogen to the ventilation channel. This cools the air in the ventilation channel and reduces its oxygen concentration. The cooling of the air is detected by the fire-suppression temperature sensor 66, and in response to the sensed temperature the fire-suppression controller controls the rate of nitrogen injection to prevent the sensed temperature falling below a predetermined lower, or minimum, level. In the second control mode, the oxygen sensor 68 measures the oxygen concentration, but this is not used as a feedback signal for controlling the nitrogen injection system, because the second control mode aims to reduce the oxygen concentration as far as possible, to extinguish a fire.

As in the first control mode, the ventilation-system controller continues to control the ventilation system, but the cooling effect of the liquid nitrogen injection advantageously causes the ventilation-system controller automatically to increase recirculation of warmed air from the server room and to decrease the inflow of cooled air from the atmosphere. This prevents dilution of the low-oxygen-concentration air in the server room.

In both the first and second control modes, it is necessary to maintain the exhaust damper 32 at a small degree of opening at all times, to allow air to escape from the system space. This prevents any pressure increase in the system space due to the injection of liquid nitrogen.

Thus, in the second control mode, the dampers may be controlled as follows:

Damper 42 is closed preventing any external air entering the system;

Damper 36 is fully open allowing full re-circulation of the system;

Damper 32 is partially open allowing air to vent from the system.

The fire-suppression controller may operate in a third control mode, in response to detection by the fire and/or smoke detectors of a particularly serious fire event or condition. Under these circumstances, it may be assumed that it is more important to extinguish a fire than to maintain any unaffected IT equipment in normal operation. In this control mode, the fire-suppression controller controls the nitrogen injection system to supply liquid nitrogen into the ventilation channel as rapidly as possible, despite any excessive cooling of the air entering the cold aisle. Thus, the temperature sensed by the fire-suppression temperature sensor 66 may fall below a predetermined, or standard-compliant, temperature but in the third control mode, this is ignored by the fire-suppression controller, which prioritises the rapid supply of nitrogen to reduce the oxygen concentration in the server room. At the same time, the ventilation-system controller may be controlled to close the atmospheric-inlet damper 42 and to close as far as possible the exhaust damper 32 (while allowing venting to prevent an unacceptable pressure rise).

FIG. 6 illustrates the fire-suppression controller 100 and the ventilation-system controller 102 as described above, illustrating the connections to the sensor inputs to each controller and the control outputs from each controller. In addition, FIG. 6 illustrates a link between the fire-suppression controller and the ventilation-system controller. In the embodiments described above, no such link is essential, because the ventilation system advantageously automatically responds to the cooling effect of the liquid-nitrogen supply by closing the atmospheric-inlet damper 42, to reduce cooling by ventilation, and increases recirculation of air through the ventilation channel 26. In an alternative embodiment, however, the fire-suppression controller and the ventilation-system controller may be coupled, and programmed so that the ventilation-system controller controls the dampers appropriately when a fire condition is detected, in order to retain a nitrogen-rich atmosphere, with reduced oxygen concentration, in the server room and to minimise the quantity of air drawn from the ambient atmosphere.

In a further embodiment, the fire-prevention temperature sensor 66 and the ventilation-system temperature sensor 50 may be implemented as a single temperature sensor.

In summary, the embodiments of the invention described above incorporate the following general features.

Liquid nitrogen is introduced to the system on the recirculation loop. The rate of addition is preferably determined by the temperature and/or oxygen level at the point of delivery of air to the server room.

The introduction of effectively pure nitrogen from typical industrial storage and vaporisation equipment cools the air and depletes the oxygen in the room, or a system space.

A control system allows different temperatures and oxygen levels to be maintained during a fire condition. The lower the oxygen level the greater the fire suppression up to a point where full extinguishing capabilities are met.

At the end of the fire condition the system reverts to normal operation, and the ventilation system is controlled so that fresh air enters the room. Oxygen levels then return to normal and cooling is again maintained by ventilation plus evaporative cooling.

The invention claimed is:

1. A temperature-control and fire-suppression system of a system space having a ventilation system which draws in ambient air through an air inlet, comprising;
   a store of a fire-suppressing gas in liquid form;
   a fluid passageway extending from the store to the ventilation system or the system space that supplies the fire-suppressing gas in liquid form to the ventilation system or the system space;
   a valve in the fluid passageway that controls the flow of the fire-suppressing gas in liquid form through the fluid passageway;
   a temperature sensor that senses a temperature in the ventilation system or the system space;
   a controller responsive to the sensed temperature that is connected to the valve and that is programmed to control the valve to supply the fire-suppressing gas in liquid form through the fluid passageway while maintaining the sensed temperature above a predetermined lower temperature; and
   a variable resistive element that is connected to and controllable by the controller to control the volume of ambient air drawn into the ventilation system through the air inlet,
   in which the controller is programmed to open the air inlet to allow ventilation, and to close, or partially close, the air inlet to allow fire suppression.

2. The system according to claim 1, in which the controller controls the valve so as to maintain the sensed temperature below a predetermined upper temperature.

3. The system according to claim 1, in which a portion of the system space requires cooling, or a supply of controlled-temperature air, during normal operation, and the system space includes an Information Technology (IT) apparatus.

4. The system according to claim 3, in which the temperature sensor is positioned to sense the temperature in the ventilation system downstream of the valve and upstream of the portion of the system space which requires cooling.

5. The system according to claim 3, in which the ventilation system includes all of, or is coextensive with, the system space, including any portion of the system space or ventilation system which requires cooling or a supply of controlled-temperature air during normal operation, and any portion of the system space or ventilation system which generates cooled air or the supply of controlled-temperature air during normal operation.

6. The system according to claim 1, in which the fire-suppressing gas in liquid form is supplied to the ventilation system such that evaporation of the fire-suppressing gas in liquid form cools, or absorbs energy from, air in the ventilation system.

7. The system according to claim 1, further comprising;
   an oxygen sensor for sensing an oxygen concentration in the air in the ventilation system;
   in which the controller is responsive to the sensed oxygen concentration to control the valve so as to maintain a predetermined oxygen concentration, or an oxygen concentration within a predetermined range of oxygen concentration, in the air in the ventilation system.

8. The system according to claim 7, in which the predetermined oxygen concentration is in a hypoxic range.

9. The system according to claim 7, in which the predetermined oxygen concentration is in a fire-extinguishing range.

10. The system according to claim 1, in which the controller is operable in first and second modes, in the first mode the valve is controlled to supply the fire-suppressing gas in liquid form while maintaining the sensed temperature above a first predetermined lower temperature, and in the second mode the valve is controlled to supply the fire-suppressing gas in liquid form either so as to maintain the sensed temperature above a second predetermined lower temperature, less than the first predetermined lower temperature, or so as to supply the fire-suppressing gas in liquid form at a maximum available rate of supply of the fire-suppressing gas in liquid form.

11. The system according to claim 1, in which the fire-suppressing gas in liquid form comprises, or is, nitrogen.

12. The system according to claim 1, in which the ventilation system comprises a recirculation loop, coupled at an air inlet and an air outlet to the rest of the system space, and the fluid passageway is arranged to supply the fire-suppressing gas in liquid form to the recirculation loop.

13. The system according to claim 1, in which during normal operation the ventilation system is arranged to draw at least a portion of the air in the ventilation system through the air intake from the ambient atmosphere.

14. The system according claim 13, wherein the ventilation system further includes an evaporative cooler.

15. The system according to claim 1, comprising a vent to allow relief of air pressure in the system space during the supply of the fire-suppressing gas in liquid form.

16. The system according to claim 15, comprising a second variable resistive element controllable by the controller to control the volume of air flowing out of the ventilation system through the vent.

17. The system according to claim 1, in which the predetermined lower temperature is a standard-compliant lower temperature.

18. A temperature-control and fire-suppression system in a system space having a ventilation system which draws in ambient air through an air inlet, comprising;
- a store of a fire-suppressing gas in liquid form;
- a fluid passageway extending from the store to the ventilation system or the system space that supplies the fire-suppressing gas in liquid form to the ventilation system or the system space;
- a valve in the fluid passageway that controls the flow of the fire-suppressing gas in liquid form through the fluid passageway;
- an oxygen sensor that senses an oxygen concentration in air in the ventilation system or the system space; and
- a controller responsive to the sensed oxygen concentration that is connected to the valve and that is programmed to control the valve to supply the fire-suppressing gas in liquid form through the fluid passageway while maintaining the sensed oxygen concentration below a predetermined oxygen concentration or within a predetermined range of oxygen concentration; and
- a variable resistive element that is connected to and controllable by the controller to control the volume of ambient air drawn into the ventilation system through the air inlet,
- in which the controller is programmed to open the air inlet to allow ventilation, and to close, or partially close, the air inlet to allow fire suppression.

19. A method of temperature control and fire suppression in a system space or ventilation system which draws in ambient air through an air inlet, comprising the steps of;
- supplying a fire-suppressing gas in liquid form to the system space or ventilation system, such that evaporation of the fire-suppressing gas in liquid form cools, or absorbs energy from, air in the system space or ventilation system;
- monitoring a temperature in the system space or ventilation system;
- controlling a variable resistive element to control the volume of ambient air drawn into the ventilation system through the air inlet, by opening the air inlet to allow ventilation, and closing, or partially closing, the air inlet to allow fire suppression; and
- controlling the supply of the fire-suppressing gas in liquid form so as to maintain the temperature above a predetermined lower temperature.

20. The method according to claim 19, in which a portion of the system space or ventilation system requires cooling or a supply of controlled-temperature air during normal operation, the system space includes an Information Technology (IT) apparatus, and in which the temperature is sensed in a flow of air downstream of a point at which the fire-suppressing gas in liquid form is supplied and upstream of the portion of the system space or ventilation system which requires the cooling or supply of controlled-temperature air.

21. The method according to claim 19, further comprising the step of sensing an oxygen concentration in air in the system space or ventilation system, and controlling the supply of the fire-suppressing gas in liquid form so as to maintain a predetermined oxygen concentration, or an oxygen concentration within a predetermined range of oxygen concentration, in the air in the system space or ventilation system.

22. The method according to claim 19, in which the predetermined lower temperature is a standard-compliant lower temperature.

23. A method of temperature control and fire suppression in a system space or ventilation system which draws in ambient air through an air inlet, comprising the steps of;
- supplying a fire-suppressing gas liquid form to the system space or ventilation system, such that evaporation of the fire-suppressing gas in liquid form cools, or absorbs energy, from the air therein;
- monitoring an oxygen concentration in air in the system space or ventilation system;
- controlling a variable resistive element to control the volume of ambient air drawn into the ventilation system through the air inlet, by opening the air inlet to allow ventilation, and closing, or partially closing, the air inlet to allow fire suppression; and
- controlling the supply of the fire-suppressing gas in liquid form so as to maintain the oxygen concentration in the air below a predetermined oxygen concentration or within a predetermined range of oxygen concentration.

* * * * *